Figure 1:
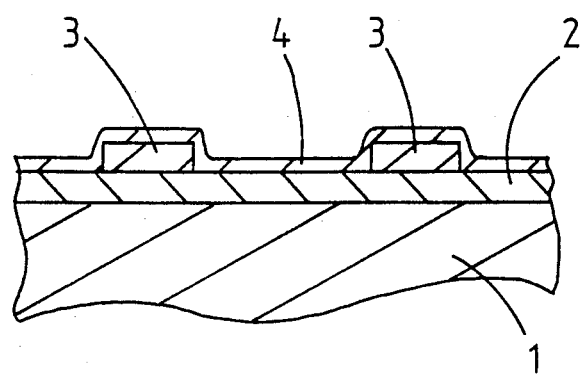

United States Patent [19]

Meyer et al.

[11] Patent Number: 4,600,686
[45] Date of Patent: Jul. 15, 1986

[54] METHOD OF FORMING A RESIST MASK RESISTANT TO PLASMA ETCHING

[75] Inventors: Joseph Meyer, Redhill; David J. Vinton, Burgess Hill, both of England

[73] Assignee: U.S. Philips Corporation, New York, N.Y.

[21] Appl. No.: 496,701

[22] Filed: May 20, 1983

[30] Foreign Application Priority Data

May 26, 1982 [GB] United Kingdom ............... 8215431

[51] Int. Cl.⁴ .............................................. G03C 5/00
[52] U.S. Cl. ................................... 430/326; 430/328; 430/330; 430/314; 430/323; 430/331; 156/628; 427/372.2
[58] Field of Search ............... 430/312, 313, 314, 315, 430/296, 317, 323, 325, 330, 326, 328, 331; 156/628, 643, 659.1; 427/372.2

[56] References Cited

U.S. PATENT DOCUMENTS

| | | | |
|---|---|---|---|
| 4,125,650 | 11/1978 | Chiu et al. | 427/337 |
| 4,259,369 | 3/1981 | Canavello et al. | 427/155 |
| 4,362,598 | 12/1982 | Griffing | 156/643 |
| 4,389,482 | 6/1983 | Bargon et al. | 430/325 |
| 4,504,574 | 3/1985 | Meyer et al. | 430/331 |

OTHER PUBLICATIONS

Flanders, J. Vac. Sci. Technol., 19(4), Nov./Dec. 1981, pp. 892–896.
Tennant et al, J. Vac. Sci. Technol. 19(4), Nov./Dec. 1981, pp. 1304–1307.
Lyman et al, J. Vac. Sci. Technol. 19(4), Nov./Dec. 1981, pp. 1325–1328.

Primary Examiner—John E. Kittle
Assistant Examiner—José G. Dees
Attorney, Agent, or Firm—Paul R. Miller

[57] ABSTRACT

A mask which is resistant to a plasma etching treatment is formed by providing an etch resistant skin over a lithographically patterned radiation sensitive resist film present on a substrate. The etch resistant skin is formed by providing a layer of, for example, chromium on the patterned resist and on the exposed surface of the substrate, and then, baking so that the chromium reacts chemically with the resist to form the etch resistant skin around the patterned film. This method may be used for example to manufacture a photo mask using a chromium coated glass substrate, or during the manufacture of semiconductor devices on a semiconductor wafer substrate.

9 Claims, 2 Drawing Figures

METHOD OF FORMING A RESIST MASK RESISTANT TO PLASMA ETCHING

This invention relates to a method of forming on a substrate a mask resistant to plasma etching, including the step of lithographically patterning a film of radiation sensitive resist which is present on the substrate.

The technique of plasma etching is well known and commonly used in the manufacture of semiconductor devices. In this context reference is invited, for example, to the article entitled "Plasma Etching in IC technology" by Kalter and van de Ven, which appeared at pages 200 to 210 of Philips Technical Review, Vol. 38, 1978/79, No. 7/8. It is noted that the term plasma etching is used in the present specification in its broad sense to include so-called reactive ion etching.

Radiation sensitive resists commonly used in the semiconductor industry are sensitive to different forms of radiation. For example, some resists are sensitive to visible light and some to X-rays, while others are sensitive to radiation in the form of beams of charged particles such as electrons. By using the so-called lithographic technique involving exposure to the appropriate radiation followed by developing in a suitable solvent, a film of resist present on a substrate can be patterned to form a mask which is resistant to a subsequent plasma etching treatment.

Radiation sensitive resists are classified as positive or negative acting. When a positive acting resist is exposed to radiation the exposed parts can be removed selectively because they become soluble in a developing solution; the unexposed parts remaining insoluble. In the case of a negative acting resist the exposed parts become insoluble while the unexposed parts remain soluble. In general positive acting resists allow better resolution than their negative acting counterparts. Thus because of their compatibility with miniaturization the semiconductor industry has tended to prefer positive acting resists for the manufacture of integrated circuits despite the fact that their resistance to plasma etching is generally inferior to negative acting resists. To counteract the problem of poor etch resistance it is usual to use a relatively thick layer (typically in the range 0.5 to 1 micrometer) of resist in order to compensate for undesirable erosion but, unfortunately, resolution is reduced as the resist thickness increases.

Attempting to improve the resistance of positive resists to plasma etching while retaining the benefit of high resolution, other workers in the art have devised different plasma etching systems and new positive resist materials. For example in his paper "Additives that Improve Positive Resist Durability for Plasma Etching", J. Electrochemical Society: Solid-State Science and Technology, Vol. 127, No. 2, February 1980, pages 491 to 497, Katsuhiro Harada claims that the etch resistance of conventional positive resists can be improved by including an additive such as a radical scavenger or a free radical, e.g. 1,1-diphenyl-2-picrylhydrazyl and galvinoxyl, or a plastics antioxidant, e.g. 2,4,6,-tritert-butylphenol. Unfortunately, however, it seems that with Harada's technique increased etch resistance is often obtained at the expense of other important properties such as the sensitivity of the resist.

According to the present invention a method of forming on a substrate a mask resistant to plasma etching, including the step of lithographically patterning a film of radiation sensitive resist present on a substrate is characterised by the further steps of providing a coating layer of material on the patterned resist film and on exposed areas of the substrate, effecting a heat treatment such that the material of the layer reacts chemically with the resist to form a plasma etch-resistant skin at the surface of the patterned resist film, and removing the unreacted material of the coating layer to leave the patterned resist film with the skin as the mask on the substrate.

In contrast with the prior art techniques mentioned above, the method of the present invention does not require new materials or new etching systems. On the contrary, it merely employs materials and processing steps which, in their own right, are well-known in the semiconductor industry.

The etch resistant skin formed in this method significantly reduces the plasma etch rate of the resist-based mask so that thinner resist films, for example less than 0.25 micrometer, can be used for increased resolution.

The advantage of a reduced plasma etch rate is particularly important when the resist is positive acting, but the method of the invention may also be used with negative acting resists.

Preferably the patterned resist film is formed on a surface layer of the substrate with the surface layer comprising the same material as the coating layer. In this case the unreacted material of the coating layer can be removed incidentally during a plasma etching step which is carried out primarily to pattern the surface layer.

Figure 2:
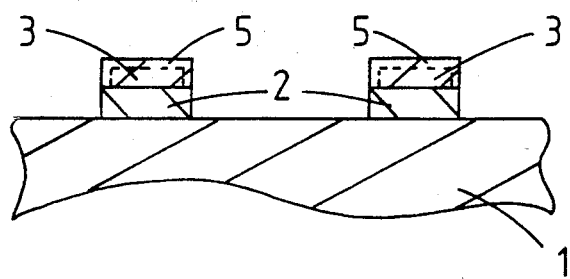

An embodiment of the invention will now be described by way of example with reference to the accompanying drawing in which FIGS. 1 and 2 are cross-sectional views showing subsequent stages in the formation of a plasma etch resistant mask on a substrate using a method in accordance with the invention.

It is noted that, for the sake of clarity, the FIGS. are not drawn to scale.

The following description relates to the manufacture of a photomask suitable for use in conventional photolithographic techniques employed in semiconductor wafer processing.

A layer 2 of chromium, typically 0.1 micrometer thick, is deposited, for example using conventional sputtering techniques onto an alumino-silicate or synthetic quartz substrate 1. A film of a cross-linked positive acting resist as described in United Kingdom Patent Specifications GB Nos. 1,445,345 and 1,500,541 is then provided on the chromium layer 2. The resist which may, for example, comprise a mixture of poly-(methyl methacrylate-co-methacrylic acid) and poly-(methyl methacrylate-co-methacryloyl chloride) is sensitive to electron radiation so that the resist film can be patterned using electron beam lithography techniques well-known to those skilled in the art. Thus, after exposure to an electron beam, the resist film is developed to leave the patterned resist film 3. A coating layer 4 of chromium having a thickness of, 50 to 100 angstroms, is then sputter deposited on the patterned resist 3 and onto the exposed areas of the chromium layer 2 so that the thickness of chromium is increased at the areas not masked by the patterned resist film 3.

Next, the chromium on the resist is caused to react chemically with the material of the underlying resist film by heating to a temperature of approximately 130° C. for 30 minutes. In this way a skin 5 is formed at the surface of the patterned resist film 3. The skin 5 is resistant to a subsequent plasma etching treatment. In FIG.

2 the boundary of this skin 5 is represented by a broken line.

The next step involves patterning the chromium layer 2 by plasma etching. At this step the patterned resist film 3 with the skin 5 acts to mask the underlying parts of the chromium layer 2. It has been found in practice that the presence of the plasma etch resistant skin 5 can cause up to a five-fold increase in the etch resistance of the mask. The chromium may be etched in a plasma containing 1 part carbontetrachloride to 1 part oxygen in 3 parts of a carrier gas such as argon or carbon monoxide at 0.5 Torr, 400 Watts for 10 minutes. As both layers 4 and 2 comprise chromium, the unreacted parts of layer 4 are removed by this etching treatment before the layer 2 is itself etched.

The patterned resist film 3 together with the skin 5 are then removed using fuming nitric acid to leave the photomask comprising the patterned opaque chromium layer 2 on the glass substrate 1.

A similar method to that described above may also be used to manufacture a photocathode mask for use in the known technique of electron beam image projection. In this case the substrate 1 would be made of quartz, but the surface layer 2 would again comprise chromium. However the patterned chromium layer and the exposed surface parts of the substrate would be coated with a photocathode material, such as caesium iodide, which can act as an electron source when the mask is flooded from behind with ultraviolet radiation.

A method in accordance with the invention may also be used directly to process a semiconductor wafer. In this case the substrate 1 would itself be the semiconductor wafer and the surface layer 2 would be a layer of material, for example an oxide, which is capable of masking the semiconductor surface against a subsequent processing step.

In the light of the description given here it will be clear to the person skilled in the art that many modifications are possible within the scope of this invention.

What we claim is:

1. A method of forming a plasma resistant mask on a substrate comprising the steps of
   forming a layer of radiation sensitive resist on a substrate,
   lithographically patterning said layer to form a patterned radiation sensitive resist layer,
   providing a layer of coating material of chromium on said patterned layer and said substrate,
   effecting a heat treatment of said coating layer such that said coating layer in contact with said resist layer chemically reacts to form a plasma etch resistant skin on said patterned resist layer, and
   removing unreacted portions of said coating layer to form said patterned resist layer with a skin coating of said coating layer as said mask on said substrate, wherein said patterned resist layer is formed on a surface layer of said substrate, said surface layer including the same material as said layer of coating material.

2. A method according to claim 1, wherein said radiation sensitive resist is positive acting.

3. A method according to claim 1, wherein said radiation sensitive resist is a cross-linked positive acting co-polymer resist.

4. A method according to claim 3, wherein said radiation sensitive resist includes a mixture of poly-(methyl methacrylate-co-methacrylic acid) and poly-(methyl methacrylate-co-methacryloyl chloride).

5. A method according to claim 1, wherein said radiation sensitive resist layer has a thickness of less than 0.25 micrometers.

6. A method according to claim 1, wherein said substrate is quartz.

7. A method according to claim 1, wherein said substrate is a semiconductor material.

8. A method according to claim 1, wherein said substrate is glass.

9. A method according to claim 1, wherein said heat treatment includes heating to a temperature of about 130° C. for 30 minutes.

* * * * *